United States Patent [19]
Lee et al.

[11] Patent Number: 5,438,419
[45] Date of Patent: Aug. 1, 1995

[54] PRECISION WAFER DRIVING DEVICE BY UTILIZING SOLID TYPE ACTUATOR

[75] Inventors: Jonghyun Lee; Yountae Kim; Bowoo Kim, all of Daejeon, Rep. of Korea

[73] Assignee: Electronics and Telecommunications Research Institute, Rep. of Korea

[21] Appl. No.: 200,577

[22] Filed: Feb. 16, 1994

Related U.S. Application Data

[63] Continuation of Ser. No. 813,370, Dec. 23, 1991, abandoned.

[51] Int. Cl.⁶ .............................................. G01B 11/00
[52] U.S. Cl. ................................... 356/399; 356/375; 356/358; 414/754; 414/757
[58] Field of Search ............... 356/244, 345, 358, 363, 356/399, 375; 318/640; 33/18.1, 18.2, 32.3; 414/754, 757, 777

[56] References Cited

U.S. PATENT DOCUMENTS

| | | | |
|---|---|---|---|
| 4,655,594 | 4/1987 | Wittekoek et al. | 356/244 |
| 4,887,904 | 12/1989 | Nakazato et al. | 356/375 |

*Primary Examiner*—Samuel A. Turner
*Attorney, Agent, or Firm*—Chernoff, Vilhauer, McClung & Stenzel

[57] ABSTRACT

A wafer positioning device providing superior precision in a very thin configuration. Piezoelectric (vs. electrostrictive) solid state actuators provide precise positioning. To provide a thin configuration, the actuators are positioned horizontally. To move the wafer vertically, and to magnify the stroke of the actuators, there are provided displacement transformers. The positioning device provides positioning along four degrees of motion. The device can be mounted onto an x-y table to provide positioning along all six degrees of motion.

8 Claims, 5 Drawing Sheets

$a:b = X:y$

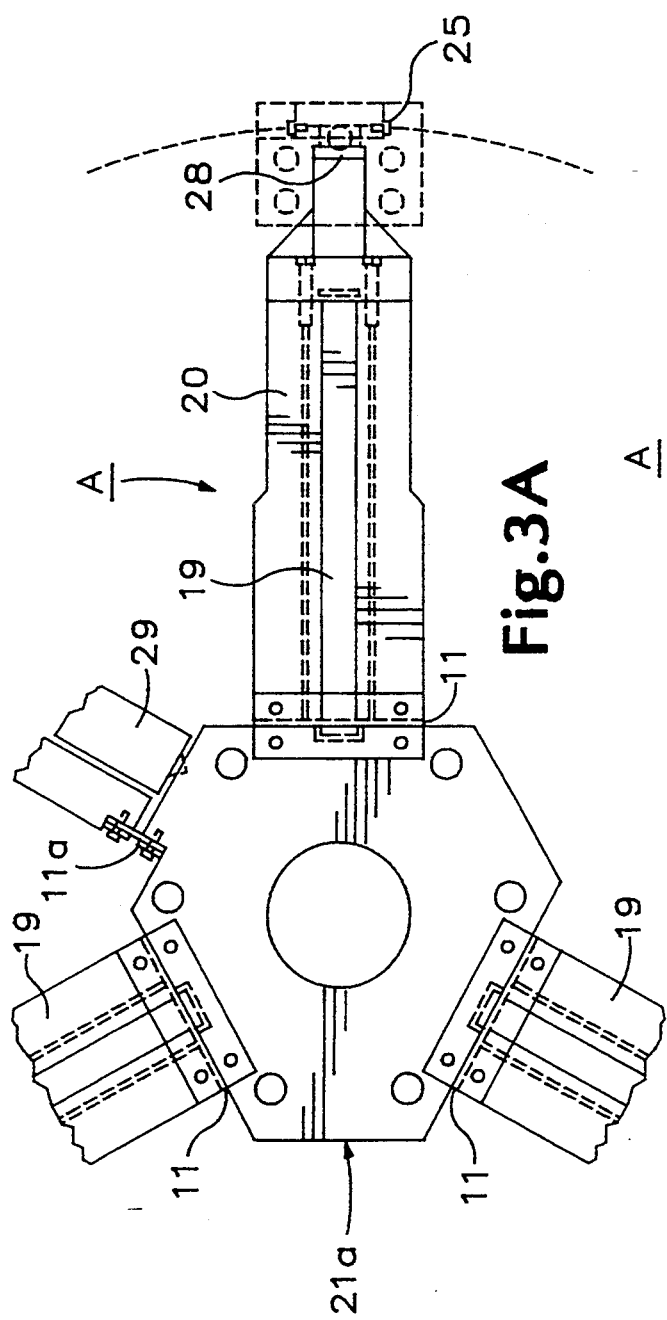
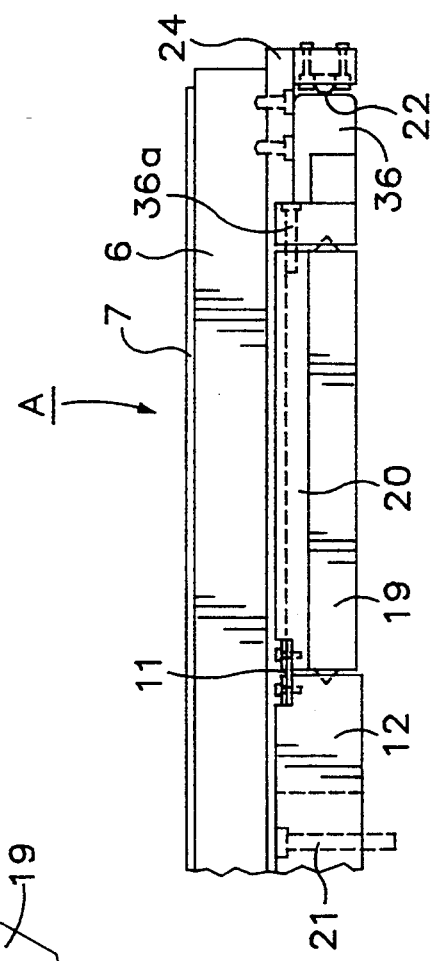
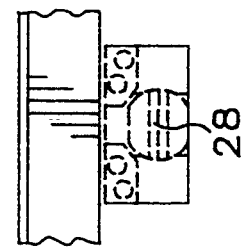

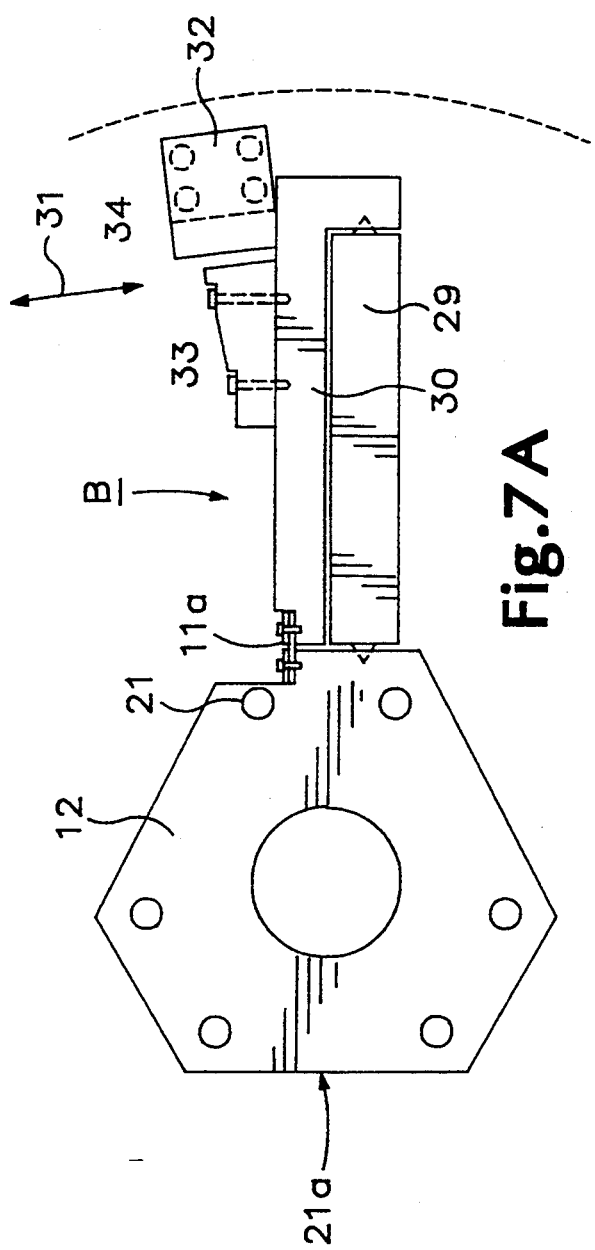
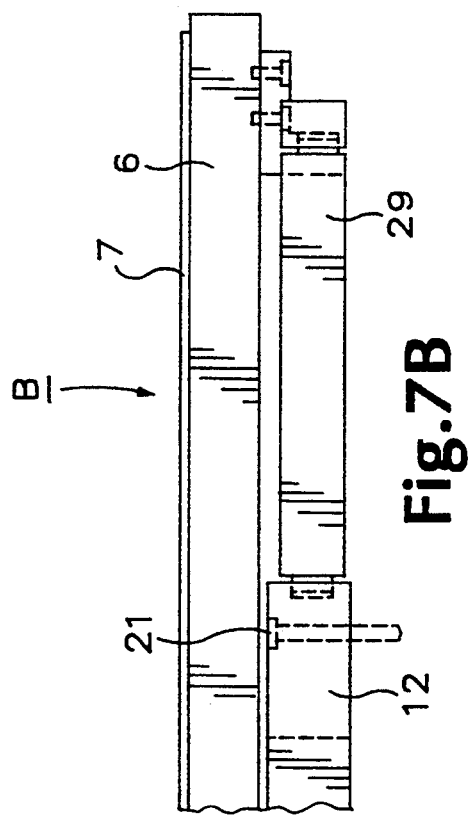
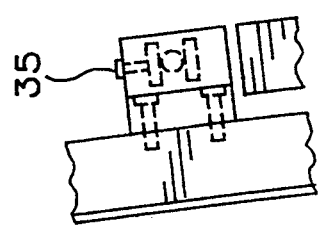
Fig.7A
Fig.7B
Fig.7C

PRECISION WAFER DRIVING DEVICE BY UTILIZING SOLID TYPE ACTUATOR

This is a continuation of application Ser. No. 07/813,370 filed on Dec. 23, 1991 now abandoned.

BACKGROUND OF THE INVENTION

This invention relates to a precision wafer-positioning device using a solid state actuator for determining an exposure position of a wafer in exposure equipment for semiconductor fabrication.

Generally a positioning device in exposure equipment should have a high degree of position accuracy and precision. The precision should correspond to one-fifth of a minimum line width of a semiconductor circuit pattern. Accordingly, a positioning mechanism having a precision greater than 0.1 μm for a horizontal direction (x,y) and a rotation direction (γ) is required for producing DRAM devices (Dynamic Random Access Memory) of more than 64 megabits. Also, the vertical position must be controlled strictly, as the surface topology becomes larger for larger wafer sizes and a depth of focus becomes small due to an increased numerical aperture of projection optics.

In a rigorous application, such as semiconductor exposure processes, the positioning mechanism should have a precision of less than 0.1 μm in a vertical direction (z) and in tilt directions (α, β). These directions are shown in FIG. 1B. In addition to the precision requirement, the stroke requirements are about 200 mm in the horizontal direction (x,y) and a few hundredths μm in the other four directions (z, γ, α, β).

A prior art wafer positioning mechanism for an exposure device has a general configuration as shown in FIG. 1 and is capable of motion along six degrees of freedom: i.e., horizontal directions (x,y), a horizontal rotation (γ), vertical direction (z), and tilt directions (α, β). Such a positioning device is disclosed in the Korean Patent Application No. 86-3573 filed with the Korean Patent Office on May 8, 1986 by the Hitach Company of Japan.

With reference to FIG. 1, a tilt device using three actuators 1 is shown on an x-y table 4, 5 and a turntable 3. The prior art tilt device can make an up-and-down motion based on the fact that a wafer holder 6 moves up-and-down when the three actuators 1 have the same displacements and the wafer holder becomes tilted if the three actuators 1 have different respective displacements. If a tilt device is assembled on a turntable 3 and x-y table 4, 5 for horizontal rotation (γ) and horizontal linear motion (x,y), respectively, Abbe's error occurs owing to a height difference between a wafer surface 7 and a laser beam 8 for an interferometer. It also has a disadvantage of taking a relatively long time for larger prior art positioning devices to settle at an exposure position because of their larger moment of inertia.

For reducing the height of a positioning device, there can be provided an open frame structure having a central space in the x-y table 4, 5 for the horizontal (x,y) motion. By installing the tilt device in the central space, the wafer surface 7 is set to be equal to the laser beam height of the interferometer. However, the area of the positioning device becomes larger owing to the central space of the x-y table 4,5. Accordingly, there is a problem of increased cost for maintaining an expensive clean room for semiconductor fabrication because the overall area of the positioning device is enlarged. Also, the wafer prealignment accuracy can deteriorate in such an open frame structure because a longer stroke of motion is required to load a wafer from a wafer carrier to the wafer holder.

SUMMARY OF THE PRESENT INVENTION

The object of this invention is to provide a high precision wafer positioning device of very thin structure utilizing three horizontally installed actuators for vertical tilt motion and one actuator for rotary motion. This device can maintain a high accuracy interferometer measurement, provide lower maintenance costs associated with a clean room without the loss of wafer prealignment.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 3A is a plan view of a wafer positioning device of the present invention.

FIG. 3B is an elevation view of the wafer positioning device shown in FIG. 3A.

FIG. 3C is a detail view of a roller bearing shown in FIGS. 3A and 3B.

FIG. 7A is a plan view of a rotary device of the present invention which rotates horizontally.

FIG. 7B is an elevation view of the rotary device shown in FIG. 7A.

FIG. 7C is a detail view of a roller bearing shown in FIGS. 7A and 7B.

DETAILED DESCRIPTION OF A PREFERRED EMBODIMENT

Figure 1A:
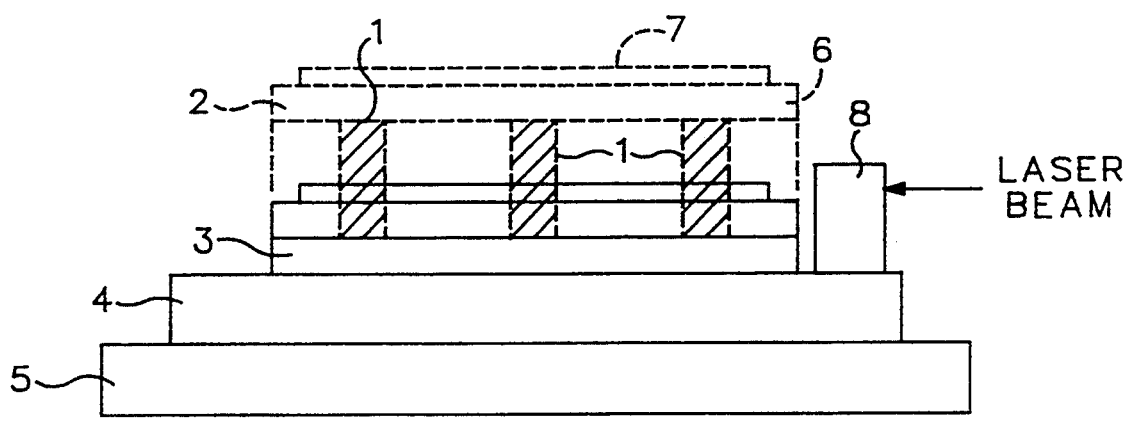
FIG. 1A is a diagramatic figure showing a prior art wafer positioning device.
Figure 1B:
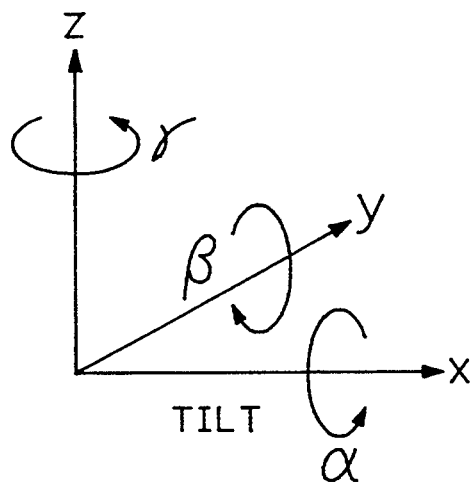
FIG. 1B shows and labels six positioning directions associated with movement of water positioning devices.

A precision wafer positioning device of the present invention will now be described with reference to FIGS. 2–7. The positioning device comprises a support block 12, four actuators 19 and 29, and four displacement transformers 20 and 30 for vertical tilt motion and horizontal rotation motion, respectively. There are four hinge springs 11 and 11a between the support block 12 and the displacement transformers 20 and 30, eight hemispherical cylinders 17 at each end of four actuators, 19 and 29, four rollers 22 and 34 between the displacement transformers and a wafer holder 6. This positioning device can be used to position a wafer 7 along four degrees of motion (z, γ, α, β) and when the invented device is attached to an x-y table the wafer may be positioned along all six degrees of motion.

Inner ends of three displacement transformers 20 are horizontally connected to the support block 12 by three hinge springs 11, which function as a center of vertical rotation. A fourth hinge spring 11a is vertically connected to the support block 12, and functions as a center of horizontal rotation. The outer ends (opposite the support block 12) of the displacement transformers 20 have two kinds of connections; one is with the outer ends of the actuators 19 and the other is with the wafer holder 6.

Figure 2:
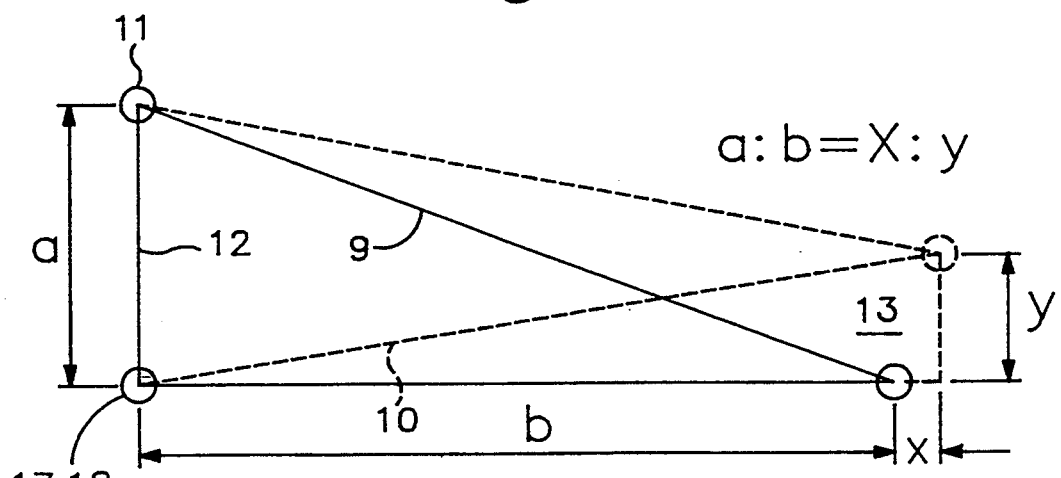
FIG. 2 is a schematic diagram showing the dimensional transformation of an actuator displacement of the present invention.

The actuators are piezoelectric or electrostrictive solid state devices that expand or contract according to an input voltage. When the solid state actuator exerts a force directly to a moving object without any intermediate media, the best performance of precision motion and response time can be obtained. However, there is a drawback that a positioning actuator should have a length of hundredths of mm for a stroke of movement of hundredths of $\mu$m. Accordingly, a mechanism of magnifying a displacement should be utilized for reducing the length of the solid state actuators. In the present invention, the displacement (or stroke) of the actuators 19 is magnified by the displacement transformers 20. FIG. 2 illustrates the operation principle of a displacement transformer represented by line 9. The solid lines 9, 10, 12 represent the relationship and connections of the displacement transformer, actuator and support block, respectively. The corner 11 represents the spring hinge 11. The dimension "a" represents the dimension between the spring hinge 11 and a connection between the actuator 19 and support block 12. The dimension "b" represents the dimension of actuator 19 before an input voltage is applied. After an input voltage is applied to an actuator 19, it expands a distance "x." As the actuator expands, the displacement transformer, represented by 9, pivots about the hinge spring 11 thus transforming a horizontal movement x in the horizontal plane into a vertical movement y. Thus, a movement stroke is magnified by the ratio b/a.

Another advantage of this invention is its compactness by installing actuators horizontally. This is possible because the displacement transformers 20 of the vertical tilt device transforms a horizontal displacement (x,y) of the actuators 19 into a vertical displacement (z).

These displacement transformers 20 also magnify the displacement and eventually transfer each displacement of actuators to the wafer holder 6 through a broad side of rollers 22.

With reference to FIG. 3, three actuators 19 are installed horizontally and connected to the displacement transformers 20 so as to reduce the height of the positioning device.

Figure 4:
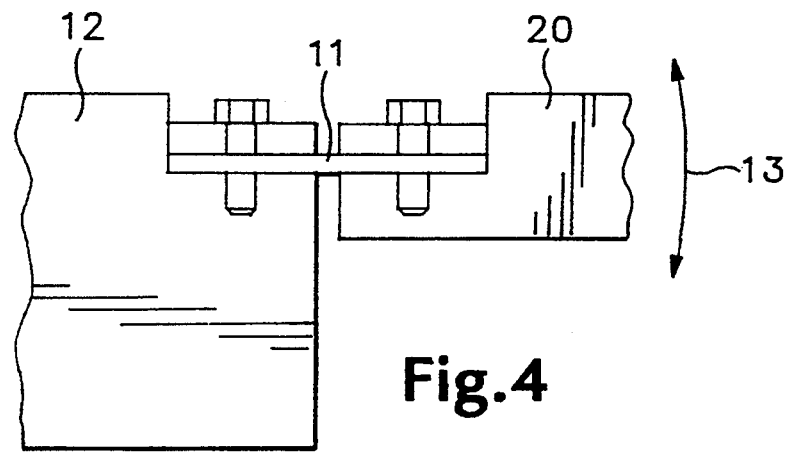
FIG. 4 is a schematic diagram of a hinge spring located between a support block and displacement transformer.

With reference to FIG. 4, the displacement transformer 20 is connected to the support block 12 by the hinge spring 11, which becomes a rotating center when the displacement transformers 20 rotate in the vertical plane.

At the connection between the support block 12 and the actuator 19, there must be sufficient stiffness along directions 15, 16 to obtain the high degree of precision motion while still permitting free vertical rotation along direction 14. For a strong stiffness of the two directions of motion 15, 16, hemispherical cylinders 17 are horizontally attached to both ends of the actuator 19. The support block is provided with V-shaped grooves 18 for carrying the cylinders 17.

Figure 5A:
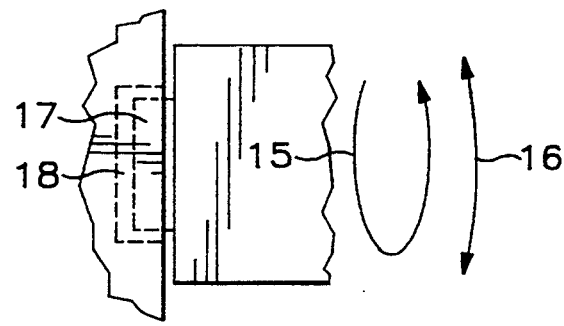
FIG. 5A is a plan schematic view of a connection between a displacement transformer and support block of the present invention.
Figure 5B:
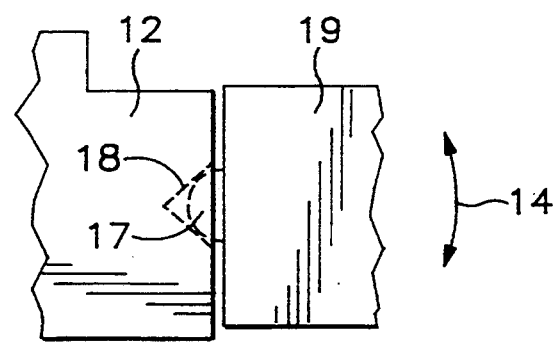
FIG. 5B is an elevation schematic view of the connection shown in FIG. 5A.

The inner end (nearest the support block 12) of the actuator 19 is connected with the support block 12 by a hemispherical cylinder 17 as shown in FIG. 5 and the outer end (farthest from support block 12) is connected to the displacement transformer 20 by the same hemispherical cylinder as shown in FIG. 3. In this mechanism, the actuator 19 is able to move easily in the direction of vertical rotation 14.

All three actuators 19 for vertical tilt motion are connected to the support block 12 in common with one another, and this support block 12 can be installed by a connection bolt 21 to a conventional horizontal x-y table to produce all six degree-of-freedom motion.

Figure 6A:
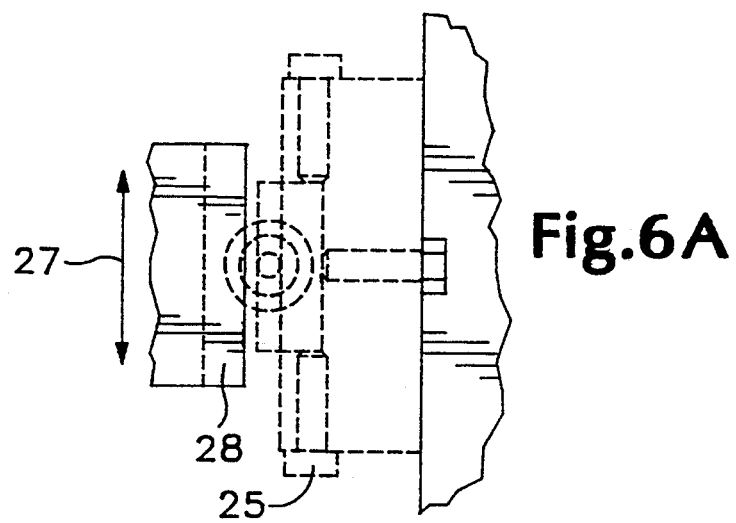
FIG. 6A is a plan schematic view of a kinematic cylindrical joint between an actuator and a displacement transformer of the present invention.
Figure 6B:
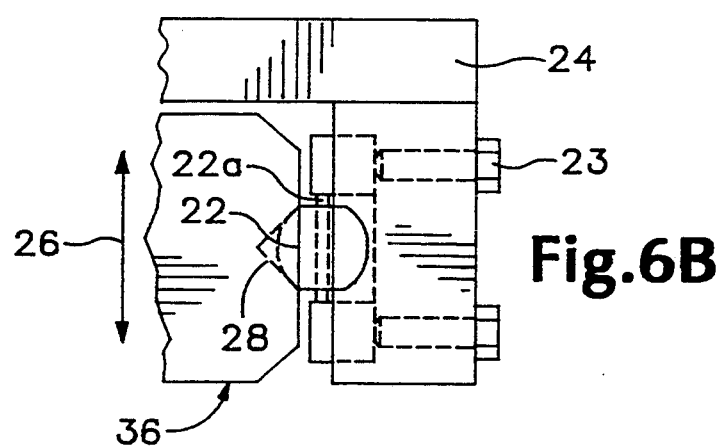
FIG. 6B is an elevation schematic view of the kinematic cylindrical joint shown in FIG. 6A.

With reference to FIG. 6, vertical tilt roller 22 is set between the wafer holder 6 and displacement transformer 20 by a set screw 25 after being pressed by a preloading adjustment bolt screw 23. Then a preloading pressure is generated between the wafer holder 6 and the displacement transformer 20 to reinforce the stiffness of the actuator in a direction of actuator length.

When the vertical tilt rollers 22 transfer the displacement of the outer end of the actuator to the wafer holder 6, they function as a driving point for the up-and-down/tilt motion.

The horizontal rotation device has the same configuration as the vertical tilt device, but rotates horizontally. The actuator for the horizontal rotation is installed horizontally in the same plane as the vertical tilt device to reduce the overall height of the positioning device. The three rollers of the vertical tilt device are used as guide elements for this horizontal rotational motion.

With reference to FIG. 7, the axial displacement of an actuator 29 for horizontal rotation is transformed to a tangential direction 31 by a displacement transformer 30. Accordingly, the wafer holder 6 connected to the displacement transformer 30 is rotated in a horizontal direction 31 and three rollers 22 of the vertical tilt device are used as a guide element for this horizontal rotation without generating any displacement of up-and-down/tilt motion.

A displacement of horizontal rotation is transferred to the wafer holder 6 in the same way as the vertical tilt device. The roller 34 is set in a vertically oriented V-shaped groove 33 and used as a driving point of the horizontal rotation device. And the rollers 22 of the vertical tilt device are used as guide elements for this horizontal rotational motion. At this time, the preloading pressure of the horizontal rotation device is adjusted by a screw 35.

In conclusion, a position device providing motion along four degrees-of-freedom (rotation (γ), vertical (z), and tilt (α, β)) is invented, and an overall height of the device is very low. This compact design results from the fact that the horizontal rotation device B is installed in the same plane as that of the up-and-down/tilt device A, and the rollers are used in common as driving points and guide elements.

The design concept described above is suitable for a precision positioning device which requires a displacement of hundredths of $\mu$m and a precision of less than 0.1 $\mu$m.

By connecting with a conventional x-y table, this precision positioning mechanism can provide six degrees of motion for semiconductor exposure equipment. The precision positioning mechanism can be also applied to information equipment such as a laser disk manufacturing equipment, and measurement equipment which require precise position control.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A precision positioning device using a solid state actuator for positioning a wafer holder 6, comprising:
   (a) a support block 12;
   (b) solid state actuators 19 to be expanded according to an input voltage, said solid state actuators 19 horizontally connected to said support block;
   (c) hinge springs 11 connected to said support block; and
   (d) displacement transformer means 20 connected to said hinge springs for transforming an axial stroke of said solid state actuators 19 into vertical movement by rotating about the hinge springs, the vertical movement being transferred to the wafer holder through rollers 22 set between the displacement transformer means and the wafer holder.

2. The positioning device of claim 1 wherein said support block 12 is connected to a conventional x-y table by a connection screw 21.

3. The positioning device of claim 1 wherein said solid state actuators 19 have a first end and a second end wherein the first end is connected to the support block 12 and the second end is connected to said displacement transformer means 20 by respective hemispherical cylinders 17.

4. The positioning device of claim 1 wherein said displacement transformer means are of an up-and-down/tilt motion and further including displacement transformer means of a horizontal rotation motion, wherein the displacement transformer means of up-and-down/tilt motion and the displacement transformer means of horizontal rotation motion are crosslinked, wherein driving force for up-and-down/tilt motion 14 is exerted to the wafer holder 6 through broadsides of the rollers 22 which are of up-and-down/tilt motion 14, and a roller 34 of a horizontal rotation device is used as a guide element for said up-and-down/tilt motion, and wherein a driving force for horizontal rotational motion 31 is exerted to the wafer holder 6 through a broadside of the roller 34 of said horizontal rotation device, said rollers 22 of up-and-down/tilt motion are used as a guide element for said horizontal rotation motion 31.

5. The positioning device of claim 1, further comprising:
   (a) said displacement transformer means 20 having a V-shaped groove 28 having a contact point; and
   (b) one of said rollers 22 attached to the wafer holder 6 and an adjustment screw 23 reinforcing a preload of said roller to enhance the motion accuracy which can rotate following said V-shaped groove 28 of said displacement transformer means 20.

6. The positioning device of claim 1 further comprising a hinge spring connected to said support block, a displacement transformer 30 connected to said hinge spring, and a solid state actuator 29 to be expanded according to an input voltage, wherein said transformer 30 transforms an axial stroke of said actuator into a horizontal movement by rotating about said hinge spring, the horizontal movement being transferred to the wafer holder through a roller 34.

7. The positioning device of claim 1 wherein said actuators are piezoelectric or electrostrictive.

8. A precision positioning device using a solid state actuator for positioning a wafer holder 6, comprising:
   (a) a support block 12;
   (b) solid state actuators 19 to be expanded according to an input voltage, said solid state actuators 19 horizontally connected to said support block;
   (c) hinge springs 11 connected to said support block;
   (d) displacement transformer means 20 connected to said hinge springs for transforming an axial stroke of said solid state actuators 19 into vertical movement by rotating about the hinge springs, the vertical movement being transferred to the wafer holder through rollers 22 set between the displacement transformer means and the wafer holder; and
   (e) hemispherical cylinders for connecting said displacement transformer means to said solid state actuators.

* * * * *

UNITED STATES PATENT AND TRADEMARK OFFICE
CERTIFICATE OF CORRECTION

PATENT NO.   : 5,438,419

DATED        : August 1, 1995

INVENTOR(S)  : Lee et al.

It is certified that error appears in the above-identified patent and that said Letters Patent is hereby corrected as shown below:

Column 1, Line 41    : delete "Hitach" insert --Hitachi--

Column 2, Line 25    : delete "water" insert --wafer--

Column 6, Line 23    : insert --29-- after "actuator"

Signed and Sealed this

Sixteenth Day of January, 1996

Attest:

BRUCE LEHMAN

Attesting Officer      Commissioner of Patents and Trademarks